United States Patent
Suarez et al.

(10) Patent No.: US 11,835,569 B2
(45) Date of Patent: Dec. 5, 2023

(54) SYSTEM AND METHOD FOR PROCESSING DATA GENERATED BY A VEHICLE END-OF-LINE TESTING ROUTINE

(71) Applicant: Ford Global Technologies, LLC, Dearborn, MI (US)

(72) Inventors: Aaron Suarez, Lerma (MX); Victor Gomez, Cuautitlan Izcalli (MX)

(73) Assignee: Ford Global Technologies, LLC, Dearborn, MI (US)

(*) Notice: Subject to any disclaimer, the term of this patent is extended or adjusted under 35 U.S.C. 154(b) by 533 days.

(21) Appl. No.: 17/066,676

(22) Filed: Oct. 9, 2020

(65) Prior Publication Data

US 2022/0113342 A1 Apr. 14, 2022

(51) Int. Cl.
| G01R 31/00 | (2006.01) |
| H04L 12/40 | (2006.01) |
| G07C 5/08 | (2006.01) |
| G07C 5/00 | (2006.01) |

(52) U.S. Cl.
CPC ........... *G01R 31/007* (2013.01); *G07C 5/008* (2013.01); *G07C 5/0808* (2013.01); *H04L 12/40* (2013.01); *H04L 2012/40215* (2013.01)

(58) Field of Classification Search
CPC .... G01R 31/007; G07C 5/008; G07C 5/0808; H04L 12/40; H04L 2012/40215; H04L 12/40071

See application file for complete search history.

(56) References Cited

U.S. PATENT DOCUMENTS

| 2008/0177438 A1* | 7/2008 | Chen ................. G07C 5/0808 701/31.4 |
| 2010/0256861 A1* | 10/2010 | Hodges ............ H04L 12/40006 701/31.4 |
| 2016/0180607 A1* | 6/2016 | Wittliff ................... G07C 7/00 701/31.4 |
| 2017/0154479 A1 | 6/2017 | Kim |
| 2018/0237029 A1* | 8/2018 | Bansal ................ G07C 5/0808 |

FOREIGN PATENT DOCUMENTS

| CN | 201681306 | 12/2010 |
| CN | 110750087 | 2/2020 |
| JP | 5617901 | 11/2014 |
| KR | 20120042303 | 5/2012 |

* cited by examiner

*Primary Examiner* — Michael V Kerrigan
(74) *Attorney, Agent, or Firm* — Burris Law, PLLC (57) ABSTRACT

A method for processing a vehicle end-of-line (EOL) testing routine includes determining whether a diagnostic trouble code (DTC) is issued during the vehicle EOL testing routine and obtaining vehicle network data generated during the vehicle EOL testing routine. The method includes, in response to a determination that the DTC is issued during the vehicle EOL testing routine, storing the vehicle network data in a database, associating the DTC with an electronic control module from a plurality of electronic control modules, identifying a designated agent from among a plurality of agents based on the DTC and a ECM-agent directory, and electronically transmitting a notification to the designated agent, where the notification provides access to the vehicle network data and the DTC.

20 Claims, 4 Drawing Sheets

SYSTEM AND METHOD FOR PROCESSING DATA GENERATED BY A VEHICLE END-OF-LINE TESTING ROUTINE

FIELD

The present disclosure relates to systems and methods for processing data generated by a vehicle end-of-line (EOL) testing routine.

BACKGROUND

The statements in this section merely provide background information related to the present disclosure and may not constitute prior art.

In a manufacturing environment, a vehicle may be subject to one or more vehicle end-of-line (EOL) testing routines to test and verify the functionality of various components of the vehicle, such as powertrain components, vehicle network components, body components, and chassis components, among others. During a vehicle EOL testing routine, the vehicle may generate one or more diagnostic trouble codes (DTCs) that uniquely correspond to a particular fault detected by one or more electronic control modules of the vehicle. Accordingly, the DTCs enable technicians and engineers to identify and troubleshoot potential issues associated with the vehicle prior to deploying the vehicles to a particular destination, such as a dealership or storage facility.

However, during the vehicle EOL testing routine, the DTCs and corresponding vehicle network data may not be available for inspection and troubleshooting by the technicians and engineers. These and other issues related to processing data generated by a vehicle EOL testing routine are addressed by the present disclosure.

SUMMARY

This section provides a general summary of the disclosure and is not a comprehensive disclosure of its full scope or all of its features.

The present disclosure provides a method for processing a vehicle end-of-line (EOL) testing routine. The method includes determining whether a diagnostic trouble code (DTC) is issued during the vehicle EOL testing routine and obtaining vehicle network data generated during the vehicle EOL testing routine. The method includes, in response to a determination that the DTC is issued during the vehicle EOL testing routine: storing the vehicle network data in a database, identifying a designated agent from among a plurality of agents based on the DTC and an electronic control module-agent (ECM-agent) directory, and electronically transmitting a notification to the designated agent regarding the DTC of the vehicle EOL testing routine, where the notification provides access to the vehicle network data and the DTC.

In some forms, the method further includes obtaining the vehicle network data from at least one of a controller area network and a local interconnect network of a vehicle.

In some forms, the method further includes associating the DTC with an electronic control module from a plurality of electronic control modules based on DTC-electronic control module correlation data, and where the designated agent is selected based on the associated electronic control module.

In some forms, the ECM-agent directory associates a plurality of DTCs with one or more designated agents assigned to address a respective DTC, and the ECM-agent directory associates the one or more designated agents with identification information.

In some forms, electrically transmitting the notification to the designated agent further includes generating a reference to the vehicle network data in the database, where the notification includes the generated reference. The method includes electronically transmitting the reference as part of the notification to the designated agent based on the identification information associated with the designated agent.

In some forms, electrically transmitting the notification to the designated agent further includes generating a DTC transmittal packet having the vehicle network data and the DTC and electronically transmitting the DTC transmittal packet as part of the notification to the designated agent based on the identification information associated with the designated agent.

In some forms, the method further includes discarding the vehicle network data in response to a determination that the DTC is not issued during the vehicle EOL testing routine.

In some forms, the method further includes selecting a set of the vehicle network data based on the DTC, where the notification provides access to the set of the vehicle network data and the DTC.

In some forms, obtaining vehicle network data generated during the vehicle EOL testing routine is performed in response to a determination that the DTC is issued during the vehicle EOL testing routine.

In some forms, the notification provides access to all of the vehicle network data from the vehicle EOL testing routine.

The present disclosure provides a method for processing a vehicle end-of-line (EOL) testing routine. The method includes performing the vehicle EOL testing routine on a vehicle, determining whether a diagnostic trouble code (DTC) is issued during the vehicle EOL testing routine, and obtaining vehicle network data generated during the vehicle EOL testing routine. The method includes, in response to a determination that the DTC is issued during the vehicle EOL testing routine: storing the vehicle network data in a database, identifying a designated agent from among a plurality of agents based on the DTC and a ECM-agent directory, and electronically transmitting a notification to the designated agent regarding the DTC of the vehicle EOL testing routine, where the notification provides access to the vehicle network data and the DTC.

In some forms, the method further includes obtaining the vehicle network data from at least one of a controller area network and a local interconnect network of a vehicle.

In some forms, the method further includes associating the DTC with an electronic control module from a plurality of electronic control modules based on DTC-electronic control module correlation data, and where the designated agent is selected based on the associated electronic control module.

In some forms, the ECM-agent directory associates a plurality of DTCs with one or more designated agents assigned to address a respective DTC, and the ECM-agent directory associates the one or more designated agents with identification information.

In some forms, electrically transmitting the notification to the designated agent further includes generating a reference to the vehicle network data in the database, where the notification includes the generated reference. The method includes electronically transmitting the reference as part of the notification to the designated agent based on the identification information associated with the designated agent.

In some forms, electrically transmitting the notification to the designated agent further includes generating a DTC transmittal packet having the vehicle network data and the DTC and electronically transmitting the DTC transmittal packet as part of the notification to the designated agent based on the identification information associated with the designated agent.

In some forms, the method further includes discarding the vehicle network data in response to a determination that the DTC is not issued during the vehicle EOL testing routine.

In some forms, the method further includes selecting a set of the vehicle network data based on the DTC, where the notification provides access to the set of the vehicle network data and the DTC.

In some forms, the vehicle EOL testing routine is one of a flash testing routine, a dynamic testing routine, a static testing routine, and a code testing routine.

In some forms, obtaining vehicle network data generated during the vehicle EOL testing routine is performed in response to a determination that the DTC is issued during the vehicle EOL testing routine.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

The present disclosure relates to systems and methods for processing data generated by vehicle (EOL) testing routines. More particularly, when a DTC is issued during a vehicle EOL testing routine, an EOL control system stores the vehicle network data in a database, identifies a designated agent based on the DTC and a ECM-agent directory, and electronically transmits a notification to the designated agent regarding the DTC of the vehicle EOL testing routine, where the notification provides access to the vehicle network data and the DTC. The EOL control system enables engineers and/or technicians (i.e., vehicle specialist) to access the vehicle network data and corresponding DTCs without accessing a physical communication port of the vehicle, such as the on-board diagnostic port of the vehicle. With the vehicle network data and corresponding DTCs, a vehicle specialist can perform corrective actions on the respective electronic control module of the vehicle. Accordingly, the EOL control system reduces the amount of time needed to troubleshoot the electronic control modules of the vehicle based on the data generated by the EOL testing routine.

Figure 1:
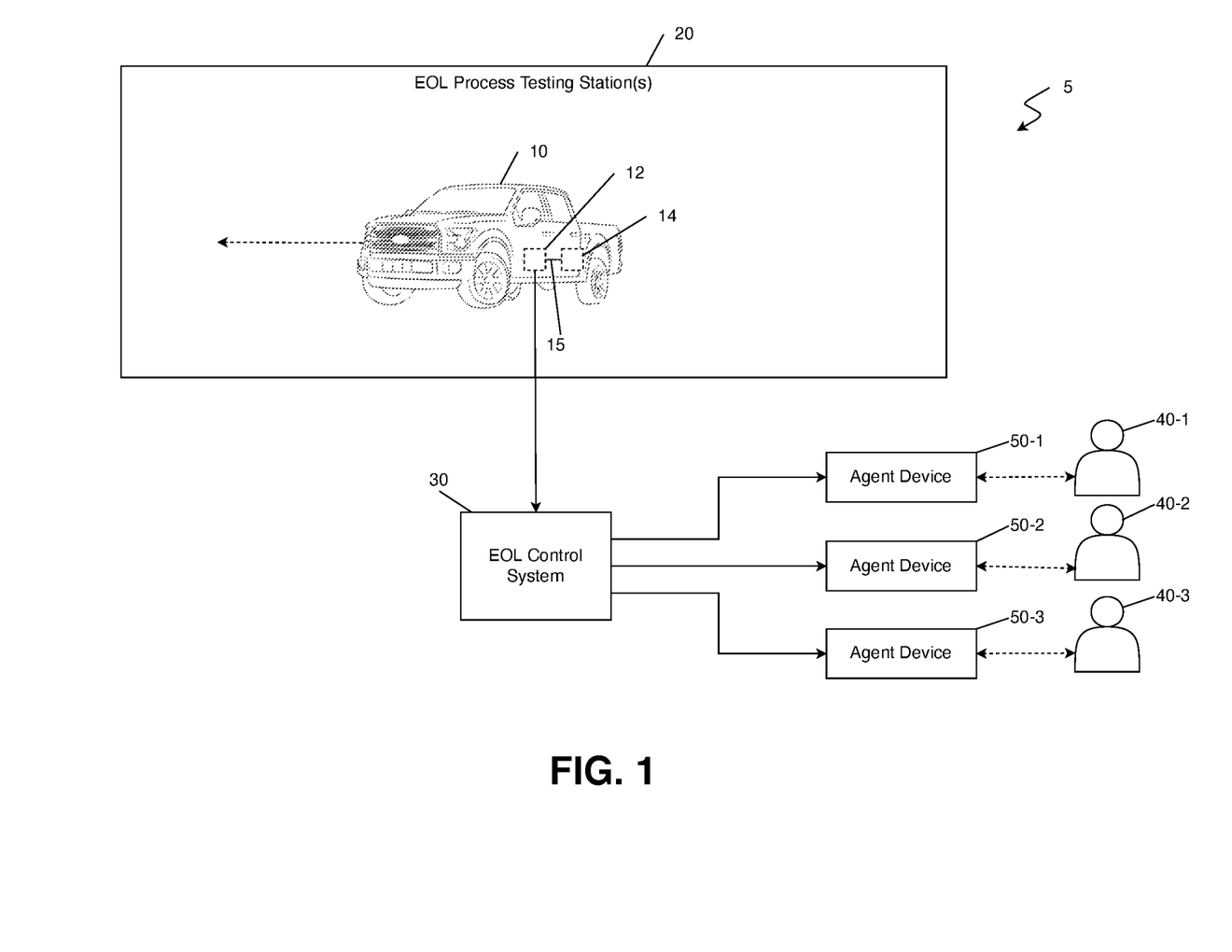
FIG. 1 illustrates a manufacturing environment according to the present disclosure.

Referring to FIG. 1, a manufacturing environment 5 for manufacturing a vehicle 10 is provided. The manufacturing environment 5 generally includes one or more vehicle EOL process testing stations 20 and an EOL control system 30. In some forms, each testing station 20 may be associated with a dedicated EOL control system 30, and/or multiple testing stations 20 may communicate with the same EOL control system 30. It should be understood that the EOL control system 30 may be positioned externally to the manufacturing environment 5 in other forms.

In an example application, the vehicle 10 includes a vehicle network data transmitter 12, electronic control modules (ECMs) 14, and a vehicle communication network 15 configured to allow the ECMs 14 to exchange data with each other and/or the vehicle network data transmitter 12. In one form, the vehicle communication network 15 is a controlled area network (CAN), a local interconnect network (LIN), and/or other suitable communication network. In the following, data generated and/or exchanged by the one or more ECMs 14 via the vehicle communication network 15 is referenced as vehicle network data and thus may be CAN-type data, LIN-type data, among others. Furthermore, the vehicle 10 includes a plurality of sensors disposed throughout the vehicle 10 (not shown) that are communicably coupled to the one or more ECMs 14 and/or the vehicle communication network 15 to provide sensor data during an EOL testing routine.

In one form, the vehicle network data transmitter 12 is an external device (e.g., a dongle) that may be attached to and detached from the vehicle 10 to transmit data generated by the ECMs 14 to an external system, such as the EOL control system 30. Specifically, in one form, the vehicle network data transmitter 12 is communicatively coupled to an on-board diagnostic (OBD) port of the vehicle 10, and the vehicle network data transmitter 12 includes various network interfacing hardware for transmitting the vehicle network data to the EOL control system 30 using at least one of a wired communication protocol (e.g., hardware for communicating via a universal serial bus, a category 5 cable, a serial cable, and the like) and/or a wireless communication protocol (e.g., hardware for communicating via a Bluetooth® protocol, a cellular protocol, a wireless fidelity (Wi-Fi) protocol, an NFC protocol, a UWB protocol, and the like).

The ECMs 14 include one or more processor circuits configured to execute machine-readable instructions stored in one or more nontransitory computer-readable mediums, such as a random-access memory (RAM) circuit and/or a read-only memory (ROM) circuit. Each of the ECMs 14 may be configured to control a particular system or subsystem of the vehicle 10. As an example, the ECMs 14 may include an engine control module for controlling operation of an internal combustion engine of the vehicle 10, a powertrain control module for controlling operation of a powertrain system of the vehicle 10, a transmission control module for controlling operation of a transmission system of the vehicle 10, a brake control module for controlling operation of a braking system of the vehicle 10, a body control module for controlling operation of various electronic accessories in the body of the vehicle 10, a climate control module for controlling operation of a heating and air conditioning system of the vehicle 10, and a suspension control module for controlling operation of a suspension system of the vehicle 10, among others.

Furthermore, the one or more ECMs 14 are configured to store a plurality of predefined DTCs and issue one or more of the predefined DTCs when a fault is detected. Each of the DTCs uniquely corresponds to a particular fault (or set of faults), and the DTCs enable a technician to diagnose the source of the fault (i.e., a particular vehicle subsystem) and the fault type.

As described below in further detail with reference to FIG. 2, the EOL control system 30 is configured to store vehicle network data in a database when a DTC is issued by the one or more ECMs 14 during a vehicle EOL testing routine. Furthermore, the EOL control system 30 is configured to identify a designated agent based on the DTC and electronically transmit a notification to the designated agent regarding the DTC of the vehicle EOL testing routine. In order to perform the functionality described herein, the EOL control system 30 includes one or more controllers, servers, databases, and/or processor circuits configured to execute machine-readable instructions stored in one or more non-transitory computer-readable mediums, such as a RAM circuit and/or ROM circuit.

In the exemplary application, the vehicle 10 arrives from an assembly line within the manufacturing environment 5 and proceeds through the one or more vehicle EOL process testing stations 20. The one or more vehicle EOL process testing stations 20 are configured to verify the functionality of various components of the vehicle 10 by executing a vehicle EOL testing routine. As an example, the one or more vehicle EOL process testing stations 20 includes a station configured to execute a flash testing routine that tests the nontransitory computer-readable medium of the ECMs 14. As another example, the one or more vehicle EOL process testing stations 20 includes a station configured to execute a dynamic testing routine that tests a vehicle response (e.g., a response of the drivetrain components, braking components, suspension and steering components, and tires, among others, of the vehicle 10) to operator inputs of the vehicle 10. Additionally, the one or more vehicle EOL process testing stations 20 includes a station configured to execute a static testing routine that calibrates the ECMs 14. As yet another example, the one or more vehicle EOL process testing stations 20 includes a station configured to execute a code testing routine that verifies at least a set of instructions of the nontransitory computer-readable memory of the or more ECMs 14. While a given EOL process testing station 20 is provided as performing a particular testing routine, it should be understood that a single EOL process testing station 20 may perform a plurality of testing routines. In addition, while specific example of an EOL test is provided, other types of EOL tests may be performed.

As the EOL process testing stations 20 execute a corresponding EOL testing routine, an ECM 14 from among the ECMs 14 of the vehicle 10 may generate a DTC that uniquely corresponds to a particular fault detected by the ECMs 14. The vehicle 10 transmits the DTCs and/or the vehicle network data to the EOL control system 30 using the vehicle network data transmitter 12. In response to receiving the DTCs and/or the vehicle network data, the EOL control system 30 is configured to identify one or more designated agents from among a plurality of agents 40-1, 40-2, 40-3 (collectively referred to as agents 40) and electronically transmit a notification to the designated agent regarding the DTC(s). The designated agent may access the notification via an agent device from among a plurality of agent devices 50-1, 50-2, 50-3 (collectively referred to as agent devices 50. The agent devices 50 may be any suitable computing devices, such as a desktop computer, a laptop, a smartphone, a smart wearable device, a tablet, among other computing devices.

Figure 2:
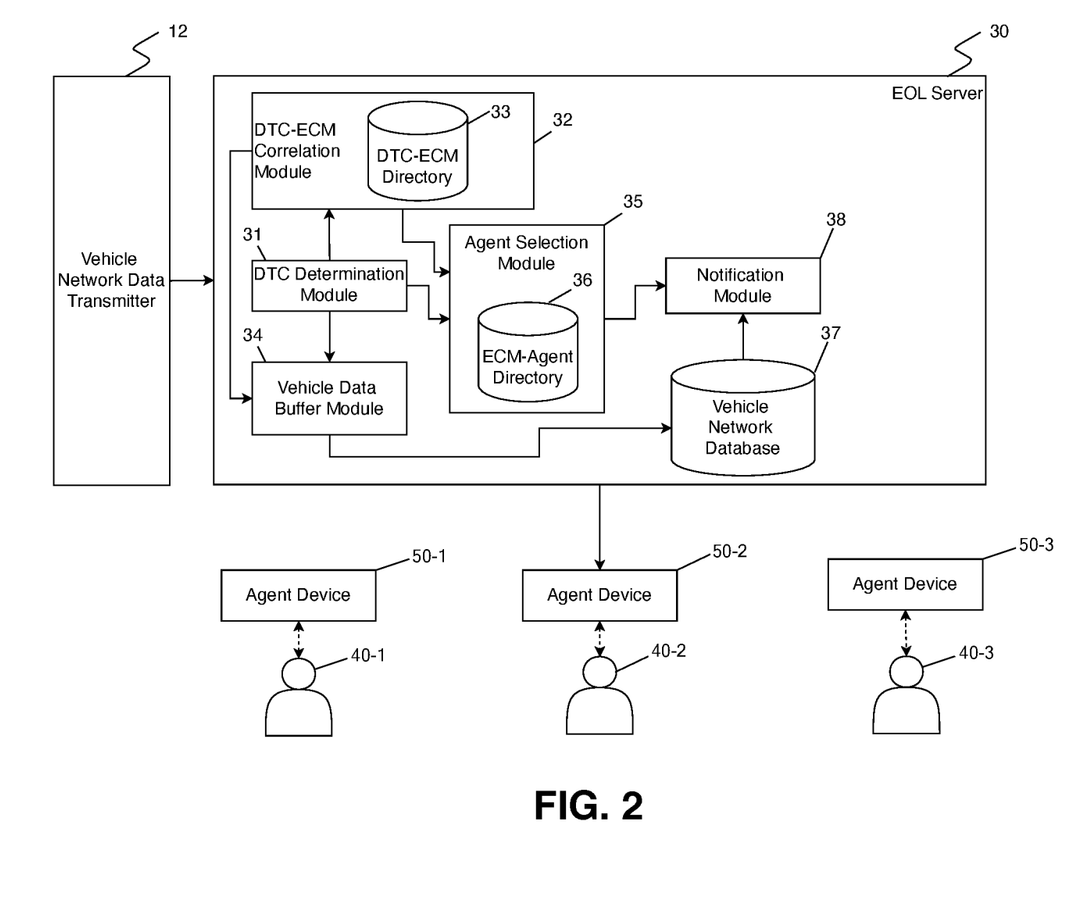
FIG. 2 is a block diagram of a vehicle end-of-line (EOL) server according to the present disclosure.

Referring to FIG. 2, a block diagram of the EOL control system 30 is shown. In one form, the EOL server includes a DTC determination module 31, a DTC-ECM correlation module 32 including a DTC-ECM directory 33, a vehicle data buffer module 34, an agent selection module 35 including an ECM-agent directory 36, a vehicle network database 37, and a notification module 38. While the DTC determination module 31, the DTC-ECM correlation module 32, the DTC-ECM directory 33, the vehicle data buffer module 34, the agent selection module 35, the ECM-agent directory 36, the vehicle network database 37, and the notification module 38 are shown as part of the EOL control system 30, it should be understood that any one of these modules may be located on separate controller(s)/servers that are communicatively coupled to one another.

The DTC determination module 31 is configured to determine whether a DTC is issued during the vehicle EOL testing routine based on the data received from the vehicle network data transmitter 12. As an example, the DTC determination module 31 is configured to recognize DTCs stored and issued by the ECMs 14.

The vehicle data buffer module 34 is configured to acquire vehicle network data generated by ECMs during the EOL test. For example, with the EOL control system 30 communicably coupled to the OBD port via the vehicle network data transmitter 12, the vehicle data buffer module 34 acquires the vehicle network data during the test. Furthermore, in response to a determination by the DTC determination module 31 that a DTC is issued during the vehicle EOL testing routine, the vehicle data buffer module 34 is configured to store the vehicle network data generated during the EOL test in the vehicle network database 37. On the other hand, if the DTC determination module 31 determines that a DTC is not issued during the vehicle EOL testing routine, the vehicle data buffer module 34 is configured to discard vehicle network data to preserve the computing resources of the EOL control system 30.

In some forms, the vehicle data buffer module 34 is configured to store a set of the vehicle network data in the vehicle network database 37, where the set is a portion of the vehicle network data that corresponds to the particular DTC. As an example, DTCs may be generally grouped into certain categories and/or subsystems of the vehicle 10 (e.g., powertrain DTCs, body DTCs, vehicle network DTCs, and chassis DTCs). As such, the vehicle data buffer module 34 may store the portion of the vehicle network data corresponding to the powertrain control module and discard the remaining vehicle network data if the DTCs are only categorized as powertrain DTCs.

The DTC-ECM correlation module 32 is configured to associate the DTCs issued during the EOL test with the ECMs 14 based on DTC-control module correlation data stored in the by the DTC-ECM directory 33. In one form, the DTC-control module correlation data is implemented by a lookup table that associates each DTC with a respective ECM 14. The DTC-ECM correlation module 32 then provides the associated ECM 14 to the agent selection module 35.

The agent selection module 35 is configured to identify a designated agent from among the agents 40 based on the DTC and the ECM-agent directory 36. In one form, the ECM-agent directory 36 is a lookup table that associates a plurality of DTCs with one or more agents 40 assigned to address a respective DTC. Furthermore, the ECM-agent directory 36 may include identification information (e.g., names, employee IDs, email addresses, contact information, phone numbers, among others) associated with each of the agents 40.

In some forms, the agent selection module 35 is configured to identify the agent from among the agents 40 based on the associated ECM as identified by the DTC-ECM correlation module 32. As an example, the agent selection module 35 identifies agent 40-2, who is assigned to address DTCs associated with a powertrain control module of the ECMs 14, based on the DTC being associated with the powertrain control module (as determined by the DTC-ECM correlation module 32) and the ECM-agent directory 36 matching agent 40-2 with DTCs associated with the powertrain control module.

The notification module 38 is configured to electronically transmit a notification to the identified agent based on the identification information of the agent to provide the designated agent access to the vehicle network data stored in the vehicle network database 37 and the DTC. In one form, the notification module 38 may generate a reference to the vehicle network data in the vehicle network database 37 and transmit the reference to the designated agent based on the identification information associated with the designated agent. As an example, the notification module 38 may generate a document management system link, as the reference, to the vehicle network data stored in the vehicle network database 37 (e.g., a Microsoft® SharePoint link that provides access to the vehicle network data). Furthermore, the notification module 38 may transmit a document management system link, as the reference, utilizing various electronic communication systems and based on the identification information, such as an email to an email address associated with the agent 40-2.

In one form, the notification module 38 may generate a DTC transmittal packet include the vehicle network data and the DTC and transmit the DTC transmittal packet to the designated agent based on the identification information associated with the designated agent. As an example, the notification module 38 may generate a compressed and/or encrypted data packet, as the DTC transmittal packet, representing the vehicle network data, and the notification module 38 may transmit the compressed and/or encrypted data packet to the agent 40-2 based on the identification information, such as an email to an email address associated with the agent 40-2 or a text message.

Figure 3:
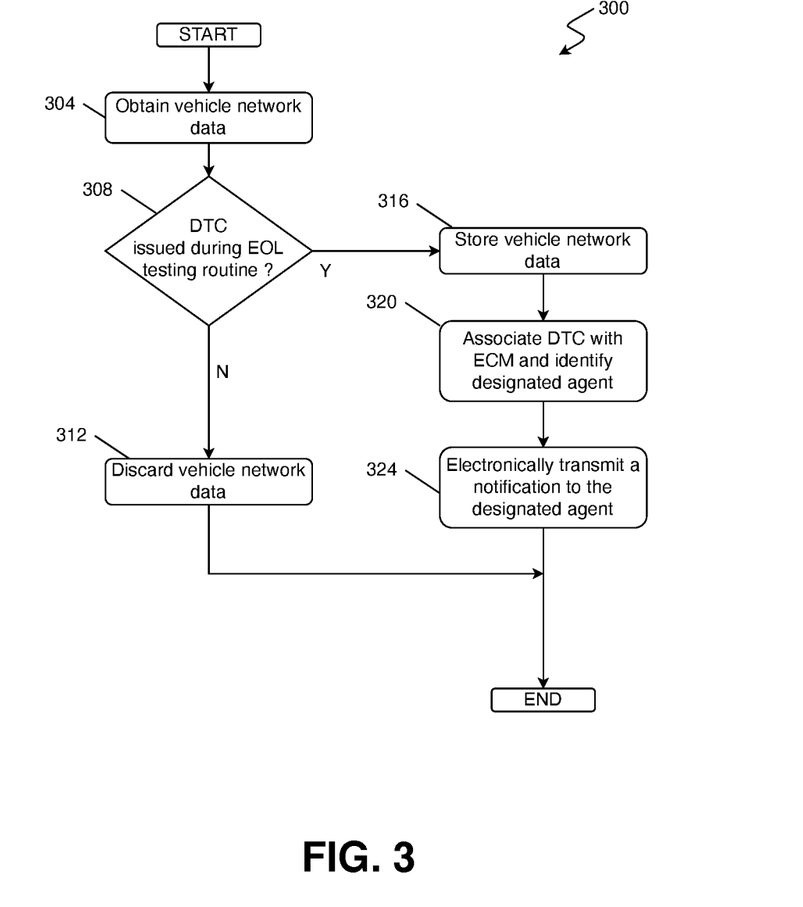
FIG. 3 is a flowchart of a routine for processing a vehicle (EOL) testing routine according to the present disclosure.

Referring to FIG. 3, a routine 300 for processing the vehicle EOL testing routine is provided and may be executed by the EOL control system 30. At 304, the EOL control system 30 obtains the vehicle network data. At 308, the EOL control system 30 determines whether a DTC is issued during the EOL testing routine. If so, the routine 300 proceeds to 316. Otherwise, if the EOL control system 30 determines that no DTC was issued at 308, the routine 300 proceeds to 312, where the EOL control system 30 discards the vehicle network data 312 and then ends.

At 316, the EOL control system 30 stores the vehicle network data (or a set of the vehicle network data based on the DTC). At 320, the EOL control system 30 associates the DTC with one or more ECMs 14 and identifies the corresponding agent 40. At 324, the EOL control system 30 electronically transmits a notification to the identified agent 40 based on the identification information associated with the identified agent. The notification provides access to the vehicle network data stored in the vehicle network database 37, and the identified agent can access the vehicle network data and/or DTC via the respective agent device 50.

Figure 4:
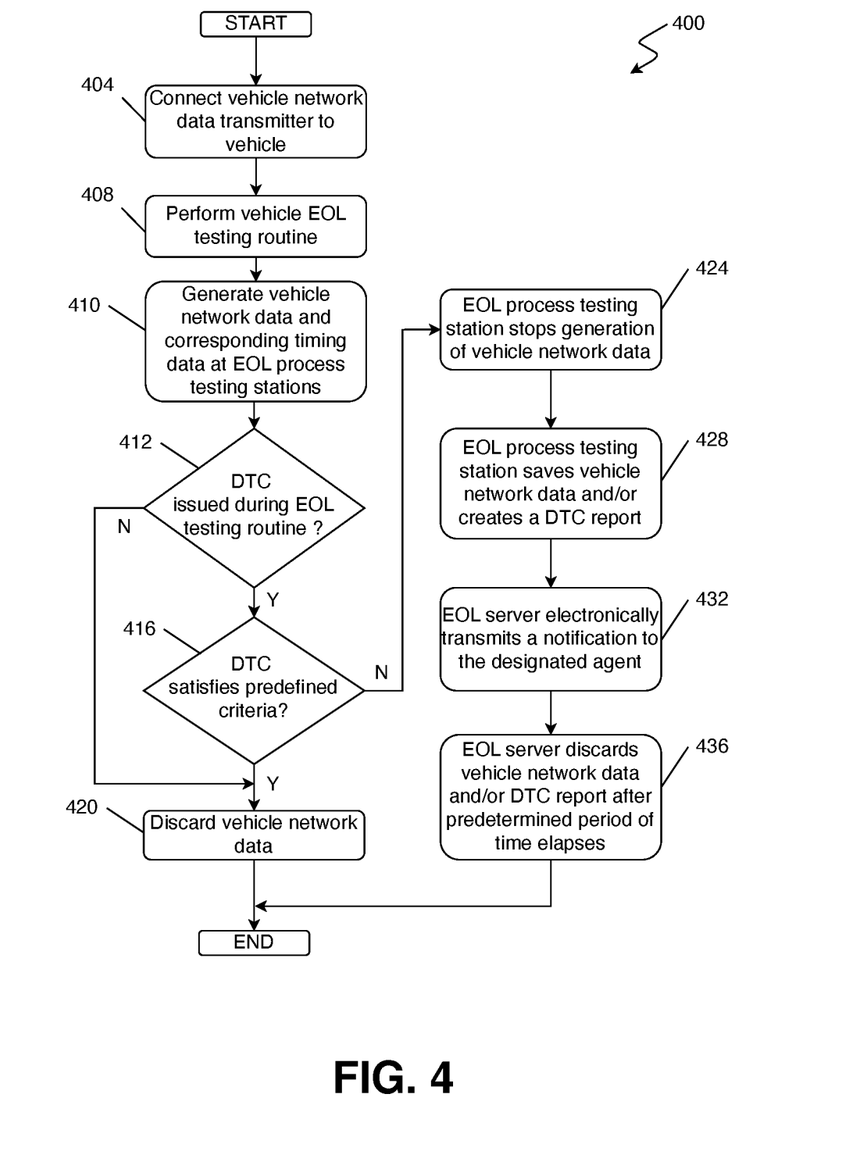
FIG. 4 is a flowchart of another routine for processing a vehicle (EOL) testing routine according to the present disclosure.

Referring to FIG. 4, another example routine 400 for processing the vehicle EOL testing routine is provided and may be executed by the EOL control system 30. At 404, an operator connects the vehicle network data transmitter 12 to the vehicle 10 (e.g., the vehicle network data transmitter 12 is connected to the OBD port of the vehicle 10). At 408, the one or more vehicle EOL process testing stations 20 perform a vehicle EOL testing routine on the vehicle 10. At 410, the one or more vehicle EOL process testing stations 20 generate vehicle network data and corresponding timing data (e.g., a timestamp associated with the vehicle network data). At 412, the EOL control system 30 determines whether a DTC is issued during the EOL testing routine. If so, the routine 400 proceeds to 416. Otherwise, if the EOL control system 30 determines that no DTC was issued at 412, the routine 400 proceeds to 420.

At 416, the EOL control system 30 determines whether the issued DTC satisfies a predefined criteria. For example, at 416, the EOL control system 30 may determine the issued DTC satisfies the predefined criteria if the DTC includes a masked bit. If the EOL control system 30 determines that the issued DTC satisfies the predefined criteria at 416, the routine 400 proceeds to 420, where the EOL control system 30 discards the vehicle network data and then ends. If the EOL control system 30 determines that the issued DTC does not satisfy the predefined criteria, the routine 400 proceeds to 424.

At 424, the one or more vehicle EOL process testing stations 20 stop generating the vehicle network data and saves the generated vehicle network and/or creates a DTC report at 428. In some forms, the DTC report may indicate the type of DTC that was issued by the vehicle EOL testing routine and a time in which the DTC was issued based on the corresponding timing data (i.e., the timestamp). At 432, the EOL control system 30 electronically transmits a notification to the identified agent 40 via the respective agent device 50, and the notification provides access to the vehicle network data stored in the vehicle network database 37 and/or the DTC report. At 436, the EOL control system 30 discards the vehicle network data and/or the DTC report after a predetermined period of time elapses (e.g., 72 hours), and the routine 400 then ends.

It should be understood that routines 300, 400 are merely example routines and other routines may be executed in other forms.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice; material, manufacturing, and assembly tolerances; and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure. Furthermore, various omissions, substitutions, combinations, and changes in the forms of the systems, apparatuses, and methods described herein may be made without departing from the spirit and scope of the disclosure even if said omissions, substitutions, combinations, and changes are not explicitly described or illustrated in the figures of the disclosure.

In the figures, the direction of an arrow, as indicated by the arrowhead, generally demonstrates the flow of information (such as data or instructions) that is of interest to the illustration. For example, when element A and element B exchange a variety of information, but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, the term "module" and/or "controller" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The module may include one or more interface circuits. In some examples the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

What is claimed is:

1. A method for processing a vehicle end-of-line (EOL) testing routine, the method comprising:
   determining whether a diagnostic trouble code (DTC) is issued during the vehicle EOL testing routine;
   obtaining vehicle network data generated during the vehicle EOL testing routine; and
   in response to a determination that the DTC is issued during the vehicle EOL testing routine:
      storing the vehicle network data in a database;
      identifying a designated agent from among a plurality of agents based on the DTC and an electronic control module-agent (ECM-agent) directory; and
      electronically transmitting a notification to the designated agent regarding the DTC of the vehicle EOL testing routine, wherein the notification provides access to the vehicle network data and the DTC via an agent device.

2. The method of claim 1 further comprising obtaining the vehicle network data from at least one of a controller area network and a local interconnect network of a vehicle.

3. The method of claim 1 further comprising associating the DTC with an electronic control module from a plurality of electronic control modules based on DTC-electronic control module correlation data, and wherein the designated agent is selected based on the associated electronic control module.

4. The method of claim 1, wherein the ECM-agent directory associates a plurality of DTCs with one or more designated agents assigned to address a respective DTC, and wherein the ECM-agent directory associates the one or more designated agents with identification information.

5. The method of claim 4, wherein electrically transmitting the notification to the designated agent further comprises:
   generating a reference to the vehicle network data in the database, wherein the notification includes the generated reference; and
   electronically transmitting the reference as part of the notification to the designated agent based on the identification information associated with the designated agent.

6. The method of claim 4, wherein electrically transmitting the notification to the designated agent further comprises:
   generating a DTC transmittal packet having the vehicle network data and the DTC; and
   electronically transmitting the DTC transmittal packet as part of the notification to the designated agent based on the identification information associated with the designated agent.

7. The method of claim 1 further comprising discarding the vehicle network data in response to a determination that the DTC is not issued during the vehicle EOL testing routine.

8. The method of claim 1 further comprising selecting a set of the vehicle network data based on the DTC, wherein the notification provides access to the set of the vehicle network data and the DTC.

9. The method of claim 1, wherein obtaining vehicle network data generated during the vehicle EOL testing routine is performed in response to a determination that the DTC is issued during the vehicle EOL testing routine.

10. The method of claim 1, wherein the notification provides access to all of the vehicle network data from the vehicle EOL testing routine.

11. A method for processing a vehicle end-of-line (EOL) testing routine, the method comprising:
- performing a vehicle end-of-line (EOL) testing routine on a vehicle;
- determining whether a diagnostic trouble code (DTC) is issued during the vehicle EOL testing routine;
- obtaining vehicle network data generated during the vehicle EOL testing routine; and
- in response to a determination that the DTC is issued during the vehicle EOL testing routine:
  - storing the vehicle network data in a database;
  - identifying a designated agent from among a plurality of agents based on the DTC and an electronic control module-agent (ECM-agent) directory; and
  - electronically transmitting a notification to the designated agent regarding the DTC of the vehicle EOL testing routine, wherein the notification provides access to the vehicle network data and the DTC via an agent device.

12. The method of claim 11 further comprising obtaining the vehicle network data from at least one of a controller area network and a local interconnect network of a vehicle.

13. The method of claim 11 further comprising associating the DTC with an electronic control module from a plurality of electronic control modules based on DTC-electronic control module correlation data, and wherein the designated agent is selected based on the associated electronic control module.

14. The method of claim 11, wherein the ECM-agent directory associates a plurality of DTCs with one or more designated agents assigned to address a respective DTC, and wherein the ECM-agent directory associates the one or more designated agents with identification information.

15. The method of claim 14, wherein electrically transmitting the notification to the designated agent further comprises:
- generating a reference to the vehicle network data in the database, wherein the notification includes the generated reference; and
- electronically transmitting the reference as part of the notification to the designated agent based on the identification information associated with the designated agent.

16. The method of claim 14, wherein electrically transmitting the notification to the designated agent further comprises:
- generating a DTC transmittal packet having the vehicle network data and the DTC; and
- electronically transmitting the DTC transmittal packet as part of the notification to the designated agent based on the identification information associated with the designated agent.

17. The method of claim 11 further comprising discarding the vehicle network data in response to a determination that the DTC is not issued during the vehicle EOL testing routine.

18. The method of claim 11 further comprising selecting a set of the vehicle network data based on the DTC, wherein the notification provides access to the set of the vehicle network data and the DTC.

19. The method of claim 11, wherein the vehicle EOL testing routine is one of a flash testing routine, a dynamic testing routine, a static testing routine, and a code testing routine.

20. The method of claim 11, wherein obtaining vehicle network data generated during the vehicle EOL testing routine is performed in response to a determination that the DTC is issued during the vehicle EOL testing routine.

* * * * *